United States Patent
Chen et al.

(10) Patent No.: US 10,127,338 B2
(45) Date of Patent: Nov. 13, 2018

(54) SYSTEM, METHOD AND ASSOCIATED COMPUTER READABLE MEDIUM FOR DESIGNING INTEGRATED CIRCUIT WITH PRE-LAYOUT RC INFORMATION

(71) Applicant: TAIWAN SEMICONDUCTOR MANUFACTURING COMPANY LTD., Hsinchu (TW)

(72) Inventors: Chin-Sheng Chen, Taoyuan (TW); Ching-Yu Chai, Hsinchu (TW); Wei-Yi Hu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 181 days.

(21) Appl. No.: 14/969,647

(22) Filed: Dec. 15, 2015

(65) Prior Publication Data

US 2017/0169146 A1 Jun. 15, 2017

(51) Int. Cl.
*G06F 17/50* (2006.01)

(52) U.S. Cl.
CPC ...... *G06F 17/5022* (2013.01); *G06F 17/5077* (2013.01)

(58) Field of Classification Search
CPC .................. G06F 17/5022; G06F 17/5077
See application file for complete search history.

(56) References Cited

U.S. PATENT DOCUMENTS

| | | | |
|---|---|---|---|
| 2002/0112212 A1* | 8/2002 | Cohn | G06F 17/5036 716/112 |
| 2004/0068712 A1* | 4/2004 | Heng | G06F 17/5068 716/52 |
| 2004/0111688 A1* | 6/2004 | Lee | G06F 17/505 716/103 |
| 2012/0023467 A1* | 1/2012 | McSherry | G06F 17/5068 716/112 |
| 2012/0053923 A1* | 3/2012 | Li | G06F 17/5036 703/14 |
| 2014/0123094 A1* | 5/2014 | Colwell | G06F 17/5077 716/126 |
| 2015/0154333 A1 | 6/2015 | Chai et al. | |
| 2015/0339429 A1* | 11/2015 | Zou | G06F 17/5081 716/52 |
| 2017/0061064 A1* | 3/2017 | Wang | G06F 17/5081 |

* cited by examiner

*Primary Examiner* — Vuthe Siek
*Assistant Examiner* — Aric Lin
(74) *Attorney, Agent, or Firm* — WPAT, P.C., Intellectual Property Attorneys; Anthony King

(57) ABSTRACT

A system for designing an integrated circuit having pre-layout RC information is disclosed. The system includes: at least one processor; and at least one memory including computer program code for one or more programs, the at least one memory and the computer program code configured to, with the at least one processor, cause the system to: generate current and voltage information for a schematic having device array layout constraint included; create interconnection topology patterns and realizing route for the schematic; generate RC information according to the route; and determine if the schematic having the device array layout constraint and the RC information included violates one or more of the system design rule constraints. An associated method and a computer readable medium are also disclosed.

20 Claims, 7 Drawing Sheets

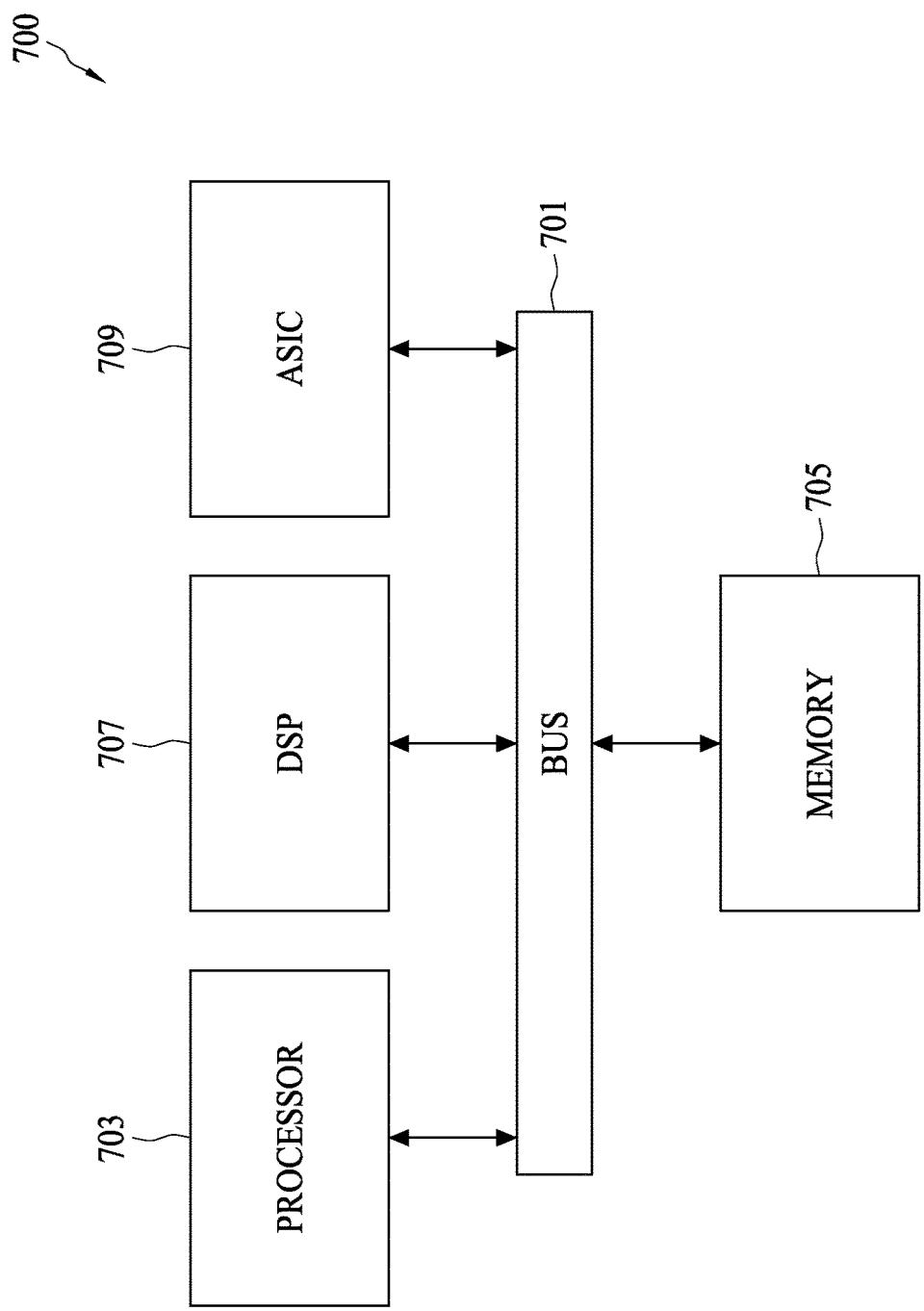

SYSTEM, METHOD AND ASSOCIATED COMPUTER READABLE MEDIUM FOR DESIGNING INTEGRATED CIRCUIT WITH PRE-LAYOUT RC INFORMATION

BACKGROUND

Integrated circuit design systems implement processes that often include generating a circuit schematic of an integrated circuit being designed, performing a pre-layout simulation on the circuit schematic to simulate a performance of the integrated circuit, generating a layout of the integrated circuit, and performing a design verification on the layout of the integrated circuit. Integrated circuit design systems sometimes perform a post-layout simulation on the layout of the integrated circuit, taking various layout-dependent effects (LDEs) into account, to reflect actual circuit performance more accurately. The integrated circuit design system typically compares the simulated performance characteristics with the design specification in order to approve or disapprove a design.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7 illustrates a chip set or chip upon which or by which an embodiment is implemented.

DETAILED DESCRIPTION

Figure 1:
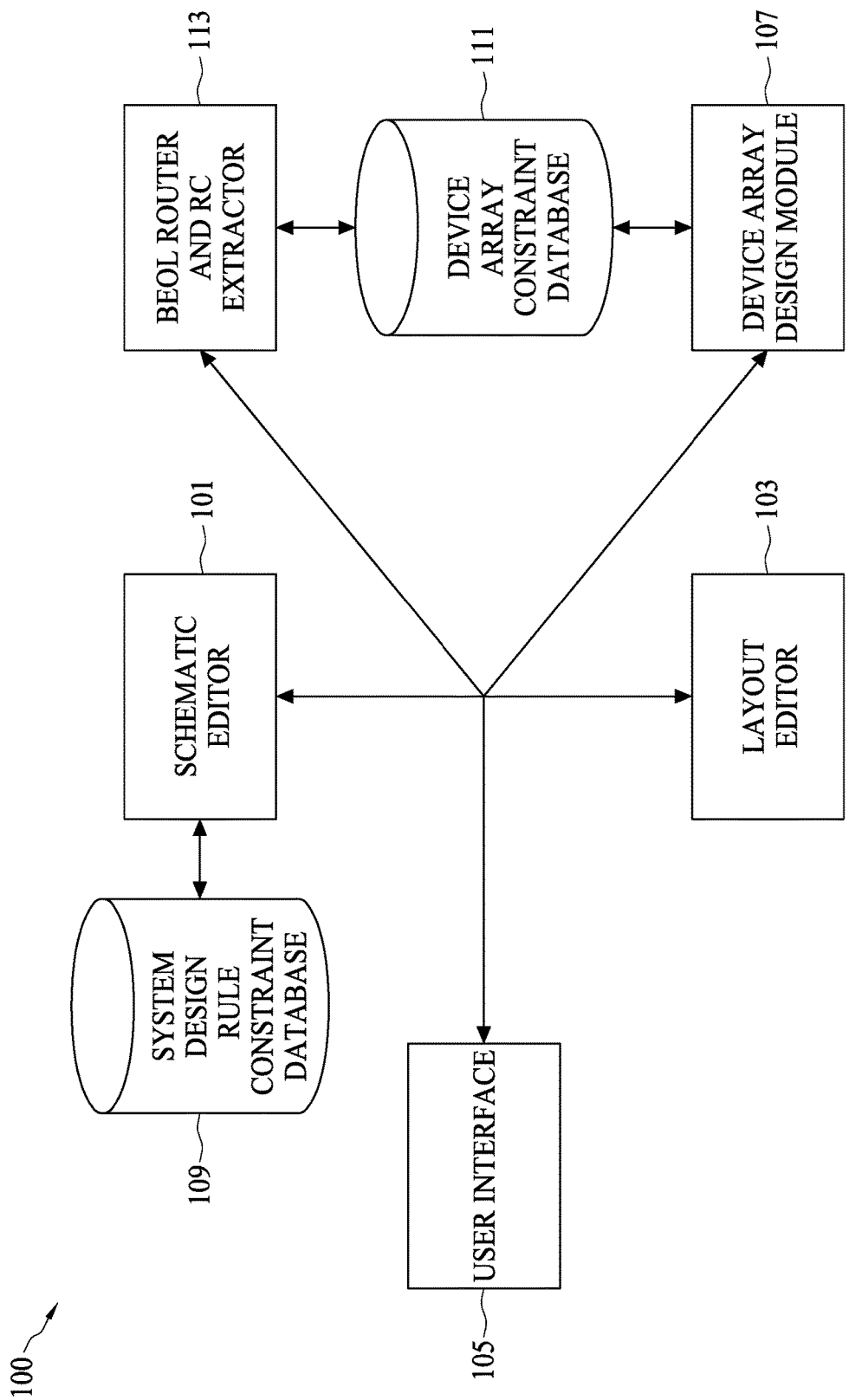
FIG. 1 illustrates a block diagram of an integrated circuit design system for designing an integrated circuit having pre-layout RC information in accordance with one or more embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In an integrated circuit design process, a circuit schematic of an integrated circuit being designed is generated first, for example, in a schematic editor. A pre-layout simulation is performed on the circuit schematic to simulate the performance of the integrated circuit. Since a layout of the integrated circuit has not yet been created at the time the pre-layout simulation is performed, layout-dependent effects (LDEs) of the layout of the integrated circuit cannot be taken into account in the pre-layout simulation. Instead, in the pre-layout simulation, default values of the LDEs are assumed.

Following the pre-layout simulation, a layout of the integrated circuit is generated, for example, using a layout editor. A design verification is then performed on the layout. The design verification typically includes an LDE parameter extraction, for example.

A post-layout simulation is then performed on the layout. In the post-layout simulation, the LDEs are taken into account, so that the generated circuit performance parameters reflect the actual circuit more accurately. The circuit performance parameters are then compared with the design specification. If the circuit performance parameters meet the requirements of the design specification, the design is approved. Otherwise, the design process reverts back to the schematic generation and editing steps, and the steps including the pre-layout simulation, the layout creation, the design verification, and the post-layout simulation are repeated to modify the design. The entire process is repeated until the circuit performance parameters meet the requirements of the design specification.

Some integrated circuit design systems implement parameterized cell (p-cell) methodologies to automatically create a device array based on an integrated circuit manufacturer's particular design rule manual (DRM). Conventional p-cell methods use, for example, p-cell symbols, schematics, and layout views when developing a device array layout for inclusion in the schematic that is subjected to the pre-layout simulation. However, p-cell methods based on the manufacturer's DRM do not have precise LDE data for inclusion at the schematic design level. For example, if the integrated circuit design system changes the schematic in any way such as flattening the p-cell device array or re-arranging any devices in the schematic design, the LDEs are not updated in real-time at the schematic level. Additionally, some existing p-cell methods are reliant on various process design kit (PDK) features such as at least some of a PDK's preset device parameters or component description formats (CDFs), bags, and callback functions. Such p-cell methods are not readable for a user to identify circuit structures such as differential pairs, current mirrors, and cascodes on a p-cell symbol.

Some integrated circuit design systems use a connectivity-driven flow effect, which is able to cross-probe a device array or a device array's pins/nets between a p-cell symbol and a p-cell layout. Such integrated circuit design systems, however, cannot cross-probe an instance or an instance's pins/nets inside the device array between the p-cell schematic and the p-cell layout. Moreover, such integrated circuit design systems are also unable to share a common guard ring for multi-device arrays represented by a p-cell.

Some integrated circuit design systems are largely dependent on PDK rules and include a stand-alone device array library. General stand alone device array libraries include device arrays that consist of, for example, p-cell symbols, p-cell schematics, p-cell layouts, CDFs, Bags, and callback functions. The stand alone libraries inherit callback functions from the PDK. This reliance on design rules associated with a PDK system limits LDE annotation or updating, which causes various processes to be needlessly repeated because various errors or deviations from the design specifications may not be discovered until a later process.

FIG. 1 illustrates a block diagram of an integrated circuit design system 100 for designing an integrated circuit having pre-layout RC information in accordance with one or more embodiments.

The integrated circuit design system 100, in some embodiments, makes it possible to reduce the number of iterations performed during the layout design process by providing a design flow that generates a device array layout automatically. The integrated circuit design system 100 annotates any LDEs attributed to or caused by the inclusion of a device array layout, in real-time, in a generated integrated circuit schematic such that the LDEs are accounted for in the schematic subjected to the pre-layout simulation. The integrated circuit design system 100 also makes it possible to verify the accuracy of an electrical design or performance of the layout when compared with design specifications.

In the present embodiment, the integrated circuit design system 100 includes a schematic editor 101, layout editor 103, a user interface 105, a device array design module 107, a system design rule constraint database 109, a device array constraint database 111, and a back end of line (BEOL) router and resistance-capacitance (RC) extractor 113, which are communicatively coupled. In some embodiments, the schematic editor 101, the layout editor 103, the device array design module 107, and the BEOL router and RC extractor 113 include one or more sets of executable instructions for execution by a processor or similar device.

Schematic editor 101 is configured to generate and edit circuit schematics of integrated circuits that are being designed. Schematic editor 101 is also configured to generate a pre-simulation of the circuit schematics. In some embodiments, schematic editor 101 includes a set of executable instructions for generating or causing the pre-simulation of the schematic. In other embodiments, a separate device (e.g., a simulator) in communication with the schematic editor 101 is used to generate the pre-layout simulation of the schematic. Layout editor 103 is configured to generate and edit layouts of the integrated circuits in accordance with the circuit schematics generated by the schematic editor 101. Device array design module 107 is configured to, based on one or more received instructions, generate a device array layout to be communicated to the schematic editor 101 for inclusion in the circuit schematic of the integrated circuit for the pre-layout simulation.

BEOL router and RC extractor 113 receives current and voltage information obtained from a previous pre-layout simulation, and one or more received instructions, including interconnection topology patterns and/or matching net constraints. The current and voltage information is stored in the device array constraint database 111 after the previous pre-layout simulation has been done. The instructions associated with interconnection topology patterns indicate device pin-to-trunk connections, and may further include limitations such as distance and location of route. BEOL router and RC extractor 113 therefore can realize route and generate parasitic RC information accordingly, which is then communicated to the schematic editor 101 for inclusion in the circuit schematic of the integrated circuit for a next pre-layout simulation. In some embodiments, a user may apply to his/her design a feasible interconnection topology pattern selected from an interconnection topology pattern database. The interconnection topology pattern selection may be automatically performed or made by the user. The interconnection topology pattern database is offline prepared by a foundry or the user based on silicon proven route patterns according to specific routing rules. The matching net constraints annotate the BEOL router and RC extractor 113 critical nets requiring a matched route, such as but not limited to differential pairs and current mirrors.

The BEOL router and RC extractor 113 is also configured to perform a real-time electromigration (EM) check and a voltage-dependent design rule check (VDRC) during route realization. The EM check is made based on an EM techfile and the current information obtained from the previous pre-layout simulation. The VDRC is made based on a Design Rule Driven (DRD) techfile and the voltage information obtained from the previous pre-layout simulation. The real-time EM check and the VDRC can help determine whether an adjustment to the interconnection topology patterns is required in order to pass the EM check and the VDRC at the pre-layout simulation phase. For example, a width parameter of the interconnection topology patterns may need to be reduced when the EM check fails.

Once the routing is completed and verified, an RC extraction is performed by the BEOL router and RC extractor 113 on the realized layout to create an RC constraint, which consists of parasitic resistance-and-capacitance networks/structures and the intrinsic circuit design for the next pre-layout simulation purpose. The RC constraint is stored in the device array constraint database 111.

User interface 105 is configured to receive and display the circuit schematic from schematic editor 101, the layout from layout editor 103, the device array layout from the device array design module 107, the interconnection topology patterns and realized route from the BEOL router and RC extractor 113, and any calculated circuit performance parameters. User interface 105 is also configured to receive user inputs to adjust the circuit schematics, the device array layout, the interconnection topology patterns and realized route, and the layout of the integrated circuit, and to select specific devices in order to display circuit performance parameters of specific devices selected by a user. In some embodiments, user interface 105 includes a Graphical User Interface (GUI).

An integrated circuit includes a plurality of devices, and the integrated circuit design system 100 enables design and layout optimization at a device level (i.e., one or more devices) within the integrated circuit according to one or more embodiments.

In some embodiments, the schematic editor 101 generates a schematic of the integrated circuit based on a set of system design rule constraints. The schematic editor 101 queries the system design rule constraint database 109 for the set of applicable system design rules and generates the schematic of the integrated circuit. The schematic of the integrated circuit includes one or more devices and also includes information for simulation purposes regarding LDEs. In some embodiments, the information regarding LDEs is a default data set.

The schematic editor 101 determines if, for example, the integrated circuit being designed includes, or is to include, a device array. If affirmative, the schematic editor 101 communicates the device array details to the device array design module 107. If not, the schematic editor 101 continues to conduct a pre-layout simulation of the schematic of the integrated circuit.

If a device array is to be included in the integrated circuit being designed, the user interface 105 provides access to a constraint manager of the device array design module 107. As a result, a device array layout free from the set of system design rules applied by the schematic editor 101 can be constructed. In some embodiments, the device array design module 107 optionally proceeds to generate an array design layout based on the set of system design rules applied by the schematic editor 101. The generated array design layout, in some embodiments, is created by way of a user input received by the user interface 105. The generated device array design layout is added to the schematic and the schematic editor 101 performs the pre-layout simulation. In some embodiments, the generated device array layout is stored in the device array constraint database 111 as a constraint view for later recall.

If, however, the device array design module 107 is instructed to generate a proposed device array layout that is free from the applied set of system design rules, the device array design module 107 makes it possible to generate a device array layout based on at least one user input received by way of the user interface 105 and/or based on a separate set of device array design rule constraints that are separately managed by the device array design module 107. The generated device array layout that is free of the system design rule constraints, in some embodiments, is stored as a constraint view in the device array constraint database 111 for later recall. In some embodiments, the device array design module 107 generates one or more device array design rule constraints that are any of user customized device array design rule constraints input by way of the user interface 105 or one or more stored constraint views. Moreover, the one or more device array design rule constraints are stored in the device array constraint database 111. Accordingly, in some embodiments, a proposed device array layout is based on an applied set of device array design rule constraints recalled from the device array constraint database 111.

In some embodiments, a proposed device array layout generated by the device array design module 107 is a schematic driven layout. For example, the user interface 105 provides an interactive schematic view of the schematic generated by the schematic editor 101. The device array design module 107 generates a proposed device array layout based on one or more known features of the schematic and any device array design rule constraints or freely enables the user to develop a device array layout. In either case, one or more devices in the schematic may move or change within the schematic, or any of the devices in the device array may introduce the movement of pre-existing devices, or the introduction of the device array may, for example, introduce one or more LDEs. Accordingly, the device array design module 107 causes the one or more LDEs to be communicated to the schematic editor 101 such that the LDEs initially in the schematic are back-annotated and updated to reflect the changes made by the device array design module 107. Back-annotating the LDEs in the schematic editor 101 results in a pre-layout simulation, which is more accurate than the pre-layout simulation, if the pre-layout simulation is based on either default or outdated LDEs. A more accurate pre-layout simulation reduces the number of refinement or revision iterations that would otherwise be necessary to account for errors or deviations from one or more design specifications or system design rule constraints.

In some embodiments, the device array design module 107 is configured to determine a pattern gradient density of the proposed device array layout of the integrated circuit, and provide real-time density aware verification of devices, such as OD, PO, MOOD, and MOPO density checks, or density checks of other suitable devices in a device array.

In some embodiments, the device array design module 107 and the BEOL router and RC extractor 113 are add-on components to an integrated circuit design system that may or may not include a conventional device array library as previously discussed. In either case, the device array design module 107 and the BEOL router and RC extractor 113, in some embodiments, are plug and play add-ons that enable device array layout generation to be free of any system design rule constraints.

Whether the device array design module 107 is an add-on or a component of an integrated system such as the integrated circuit design system 100, the device array design module 107 provides design array layouts that are more readable on the schematic design structures, such as a differential pairs, current mirrors, cascodes, or other suitable structures because these structures are not restricted by the set of system design rule constraints. The device array design module 107 also provides seamless connectivity-driven flow on devices and pins/nets inside a device array between schematic and layout views. The device array design module 107 is further able to support abutment, add pins, and share guard rings easily.

In some embodiments, the device array design module 107 and the BEOL router and RC extractor 113 are applicable to advanced processes, such as N16 or N10 FinFET processes and beyond. For example, the device array design module 107 and the BEOL router and RC extractor 113 make it possible to provide accurate array placement and route, insert identical dummy structures, insert mid-end-of-line (MEOL) dummy structures, perform density checks, create guard rings, create common OD abutments and pin shapes, back-annotate LDE parameters that affect pre-layout simulations and development cycle times, provide seamless connectivity-driven flow on devices and pins/nets inside a device array between the schematic and layout views, and generally simulate or provide information about any layout behavior.

The device array design module 107, in some embodiments, directly sets up constraints on selected devices through electronic design automation tools that link with a manufacturer's device array application protocol interface. In some embodiments, the device array design module 107 makes it possible to access the design array constraint database 111 to create a complete device array in a design layout view, In some embodiments, the schematic editor 101 receives the generated proposed device array layout from a device array design module 107 and generates a revised schematic of the integrated circuit including the proposed device array layout. This revised schematic of the integrated circuit, which includes the proposed device array layout, is optionally free of any system design rule constraints, as discussed above. As such, the schematic editor 101 performs the pre-layout simulation to determine if the revised schematic violates one or more of the system design rule constraints. If the revised schematic violates any system design rule constraints, the schematic editor 101 repeats the device array generation until a schematic is generated and passes the pre-layout simulation.

If the revised schematic passes the pre-layout simulation, the layout editor 103 generates a layout of the integrated circuit based on the revised schematic of the integrated circuit. In some embodiments, the layout editor 103 is configured to compare the revised schematic of the integrated circuit with a layout design of the semiconductor device in order to determine if the generated layout conforms to the design specifications associated with the integrated circuit being designed. If affirmative, the integrated circuit is optionally produced. If not, the integrated circuit design system 100 refines the schematic or refines the layout and repeats the processes discussed above until a layout of the integrated circuit is generated and passes the design specification performance check.

Figure 2:
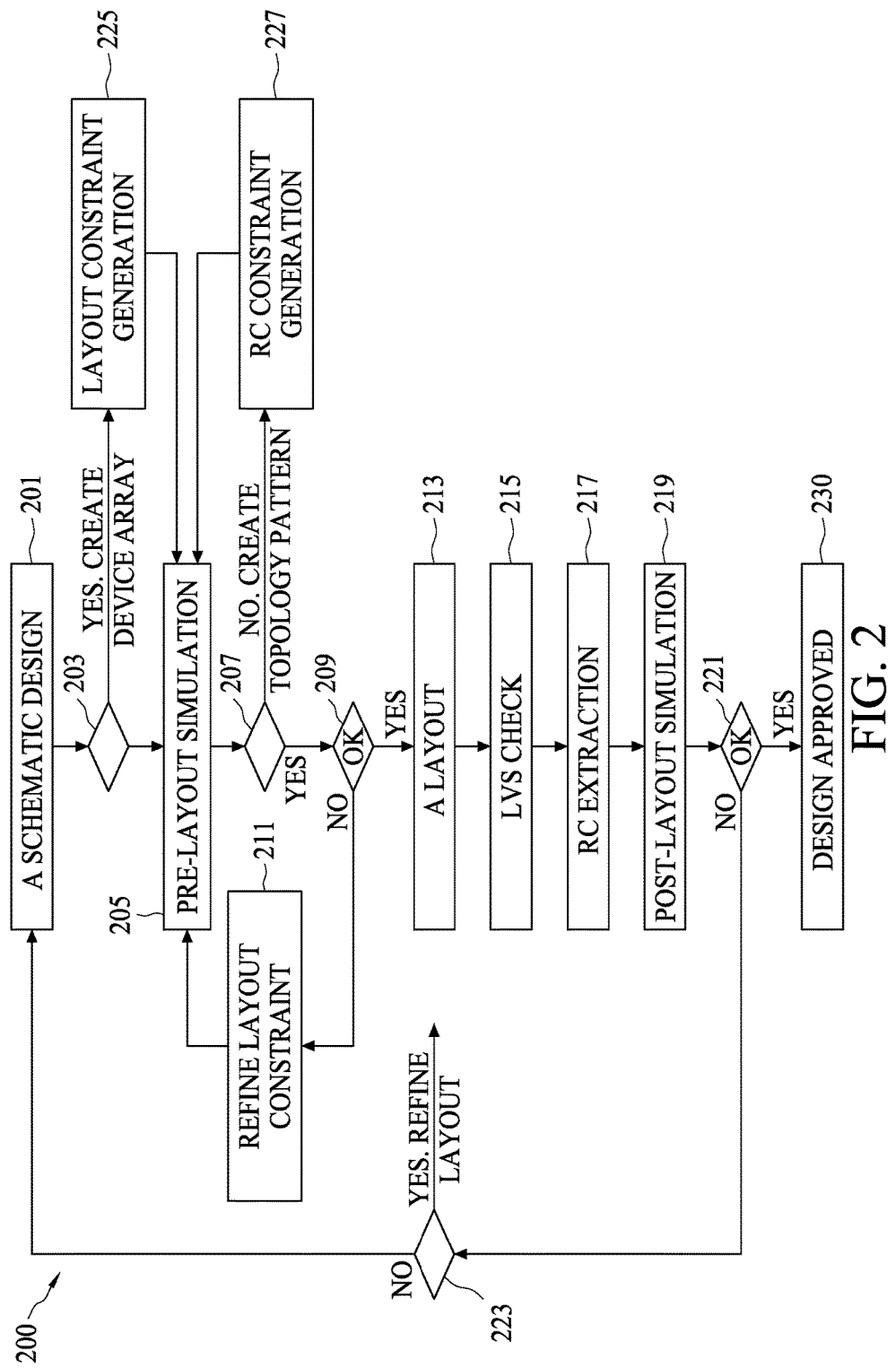
FIG. 2 is a flowchart of a method of designing an integrated circuit having pre-layout RC information.

FIG. 2 is a flowchart of a method 200 of designing an integrated circuit having pre-layout RC information. Referring to FIG. 2, in operation 201, a schematic design of an integrated circuit is generated. In an embodiment, the schematic design is generated by a processor or a control module by executing an instruction. Details of the processor or control module will be discussed by reference to FIG. 7.

In operation 203, it is determined whether a device array is to be created or edited. If affirmative, layout constraint generation is performed in operation 225. Operation 225 includes sub-operations, which are discussed in detail below by reference to FIG. 3.

Figure 3:
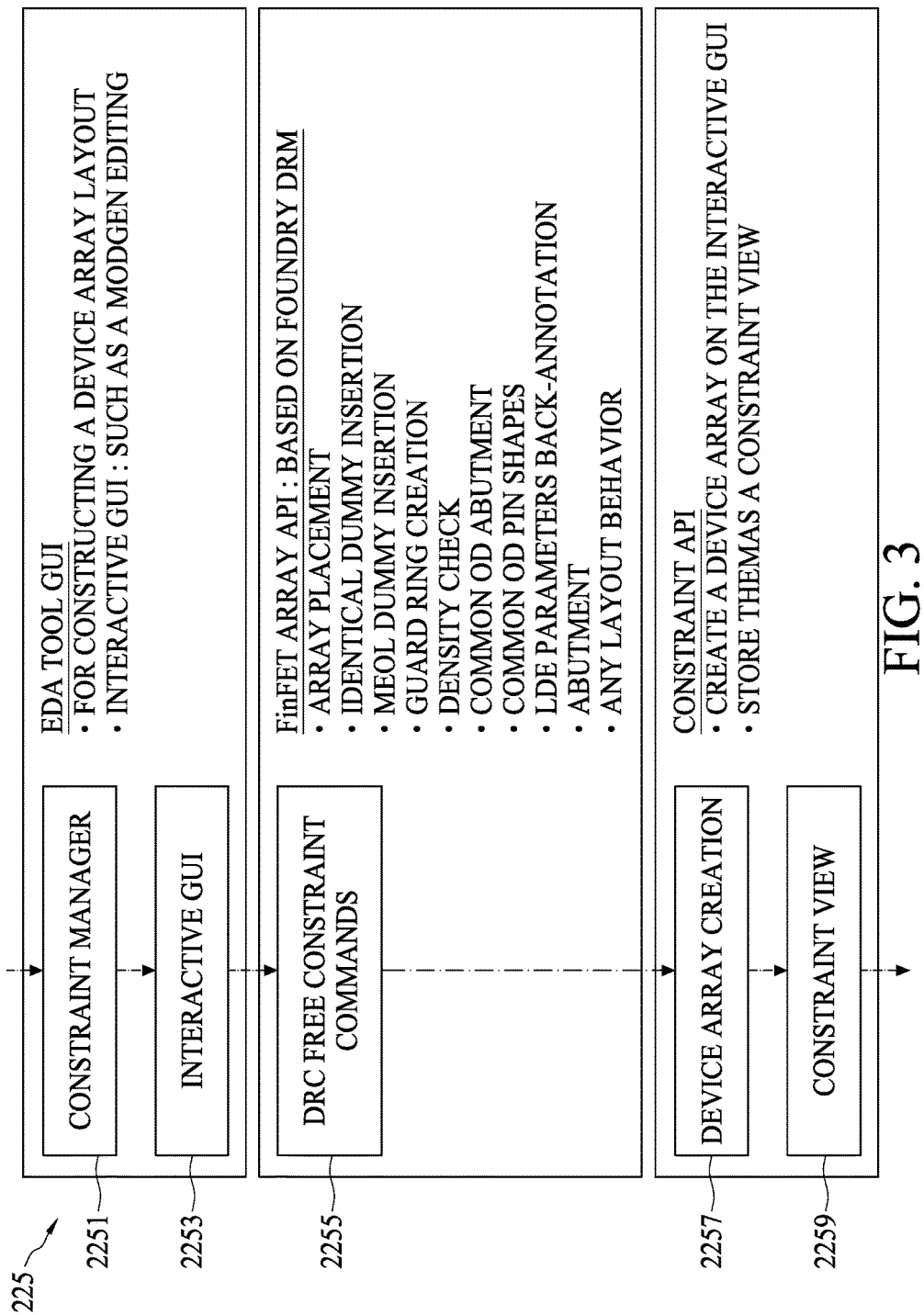
FIG. 3 is a flowchart of layout constraint generation of the method, in which sub-steps encompassed by a step of FIG. 2 are illustrated.

FIG. 3 is a flowchart of layout constraint generation of the method 200, showing sub-operations 2251-2259 of operation 225. In operation 2251, an electronic design automation tool accesses a constraint manager. In operation 2253, an interactive graphical user interface is actuated. In operation 2255, a system design rule-free command module is accessed to provide a plurality of device array layout design options. The device array layout design options include, for example, array placement, identical dummy insertion, MEOL dummy insertion, guard ring creation, density check, common OD abutment, common OD pin shapes, LDE parameters back-annotation, abutment, or any suitable layout behavior. A device array design layout is created by way of user interaction with the user interface at the schematic level in which devices are inserted and/or rearranged, which sometimes causes known or assumed LDEs to change.

In operation 2257, the device array is generated. Subsequently, in operation 2259, the generated device array is optionally stored as a constraint view or device array design rule constraint. Next, the generated device array is communicated to the schematic editor for inclusion in the schematic in the pre-layout simulation conducted in operation 205. The device array design rule constraints are optionally stored as sample arrays or device array design rules for later recall or application. These sample arrays or device design rules facilitate the integrated circuit design. In some embodiments, the constraint view or the device array design rule constraints are checked on the revised schematic before the pre-layout simulation.

If in operation 203, it is determined that a device array is not to be created or edited and added to the schematic, then in operation 205, a pre-layout simulation is performed. In some embodiments, the set of system design rule constraints are checked at the revised schematic design stage before the pre-layout simulation is performed. After the pre-layout simulation, current and voltage information can be obtained for use in subsequent operations.

In operation 207, it is determined whether the pre-layout simulation performed in operation 205 has an RC constraint incorporated with respect to the current layout constraint of the schematic design of the integrated circuit. If not, an RC constraint with respect to the current layout constraint has not been created and plug-in during the pre-layout simulation. Next, RC constraint generation is performed in operation 227. Operation 227 includes sub-operations, which are discussed in detail below by reference to FIG. 4.

Figure 4:
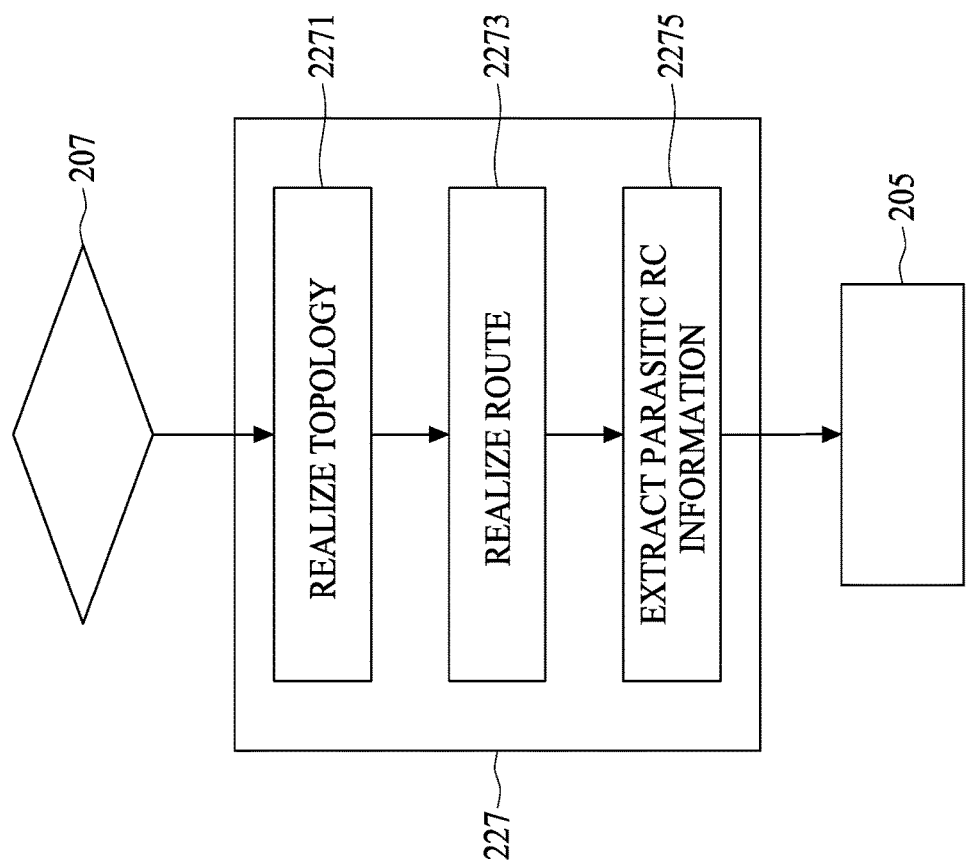
FIG. 4 is a flowchart of RC constraint generation of the method, in which sub-steps encompassed by a step of FIG. 2 are illustrated.

FIG. 4 is a flowchart of RC constraint generation of the method 200, showing sub-operations 2271-2275 of operation 227. In operation 2271, interconnection topology patterns are realized and displayed in the user interface 105. Further, the BEOL router and RC extractor 113 realizes route based on the interconnection topology patterns in operation 2273, and performs RC extraction in operation 2275 with respect to the generated route.

Returning back to operation 207, if an RC constraint with respect to the current layout constraint has been created and plug-in during the pre-layout simulation, then in operation 209, it is determined whether the circuit design represented in the schematic meets the design specification. If not, the layout constraint may be refined in operation 211 and redo operation 205. Since the layout constraint has been modified and the previous RC constraints have been outdated, the redo of pre-layout simulation is performed without RC constraints. In some embodiments, the schematic design of the integrated circuit may be refined.

Returning back to operation 209, if the circuit design represented in the schematic meets the design specification, then in operation 213, a layout of the integrated circuit is generated. In some embodiments, a design rule check is performed by a DRC tool that is either in communication with, or included as a part of, the layout editor. In operation 215, the layout is compared with the schematic. In some embodiments, a layout editor generates the layout and is either in communication with, or includes, a layout versus schematic (LVS) tool configured to compare a schematic design of the semiconductor device with a layout design of the semiconductor device.

In operation 217, an RC extraction is performed by an RC extraction tool on the schematic design or the layout and creates a new extracted netlist, view, or database which consists of parasitic resistance-and-capacitance networks/structures and the intrinsic circuit design for the post-layout simulation purpose. In some embodiments, the RC extraction tool is either in communication with, or included as a part of, the layout editor.

In operation 219, the post-layout simulation is performed by using the extracted netlist, view, or database. In operation 221, a design specification check is performed on the results of the post-layout simulation. If the post-layout simulation meets the design specification, in operation 230, the circuit design is approved. If the post-layout simulation fails on the design specification, then in operation 223, it is determined to either refine the layout or refine the schematic. If the layout is refined, the method 200 repeats operation 213. If the schematic is refined, then the method 200 repeats operation 201.

Figure 5:
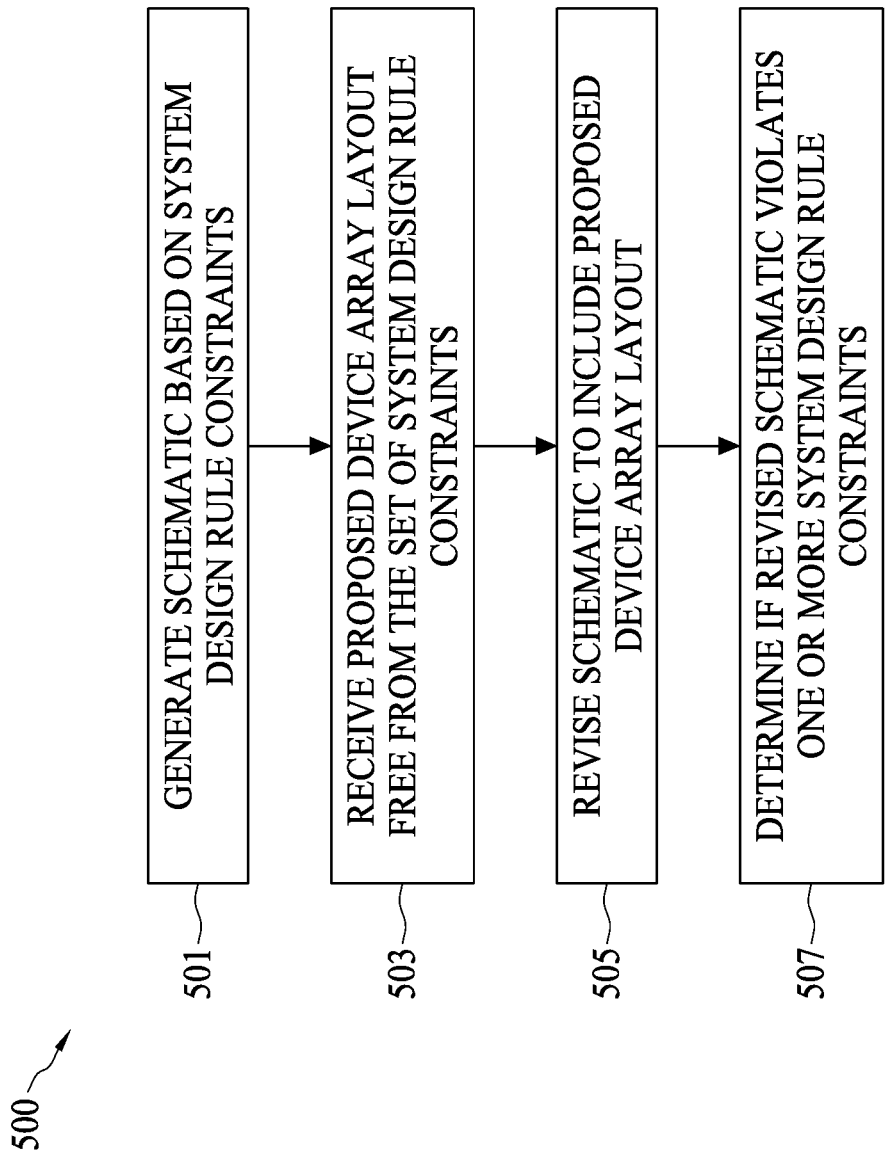
FIG. 5 is a flow chart of a method of designing an integrated circuit having a device array free from a set of system design rule constraints, in accordance with one or more embodiments.

FIG. 5 is a flow chart of a method 500 of designing an integrated circuit having a device array free from a set of system design rule constraints, in accordance with one or more embodiments. Referring to FIG. 5, in operation 501, a processor such as processor 703 or a control module implemented in chip set 700 discussed in FIG. 7 executes an instruction to generate a schematic of the integrated circuit based on a set of system design rule constraints.

In operation 503, a proposed device array layout is received from a device array design module. The device array design module is configured to generate the proposed device array layout free from the set of system design rule constraints. In some embodiments, the device array design module is an add-on to a pre-established integrated circuit design system and optionally overrides one or more standard device array libraries previously associated with the integrated circuit design system.

In operation 505, a revised schematic of the integrated circuit including the proposed device array layout is generated. Subsequently, in operation 507, it is determined if the revised schematic violates one or more of the system design rule constraints.

Figure 6:
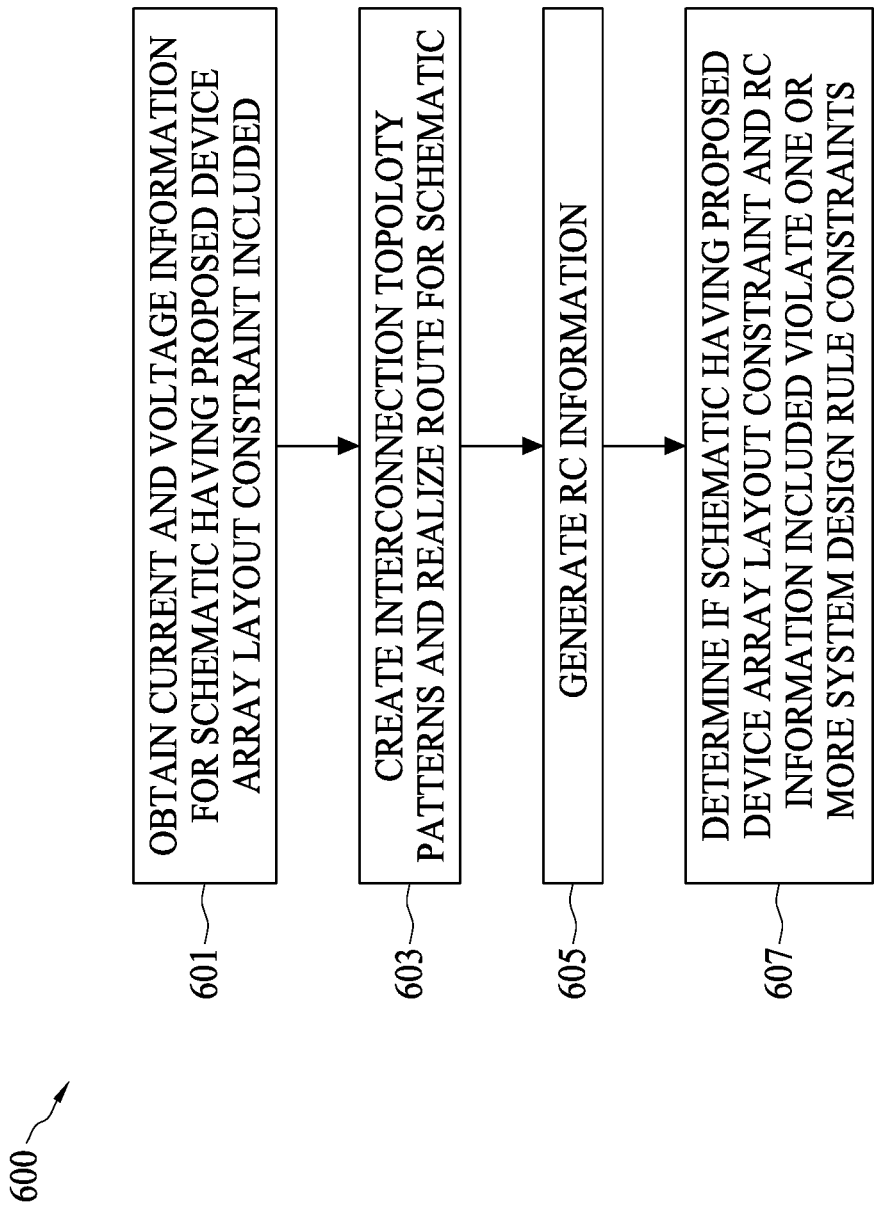
FIG. 6 is a flowchart of a method of designing an integrated circuit having pre-layout RC information, in accordance with one or more embodiments.

FIG. 6 is a flowchart of a method 600 of designing an integrated circuit having pre-layout RC information, in accordance with one or more embodiments. Referring to FIG. 6, in operation 601, a processor such as processor 703 or a control module implemented in chip set 700 discussed in FIG. 7 executes an instruction to generate current and voltage information for a schematic having device array layout constraint included.

In operation 603, interconnection topology patterns are created and route for the schematic are realized.

In operation 605, RC information is generated according to the route. Subsequently, in operation 607, it is determined if the schematic having the device array layout constraint and the RC information included violates one or more of the system design rule constraints.

The processes described herein for designing an integrated circuit having a device array free from a set of system design rule constraints may be advantageously implemented via software, hardware, firmware or a combination thereof. For example, the processes described herein may be advantageously implemented via processor(s), Digital Signal Processing (DSP) chip, an Application Specific Integrated Circuit (ASIC), Field Programmable Gate Arrays (FPGAs), etc. Such exemplary hardware for performing the described functions is detailed below.

FIG. 7 illustrates a chip set or chip 700 upon which or by which an embodiment is implemented. Chip set 700 is programmed to design an integrated circuit having a device array free from a set of system design rule constraints, as described herein, and includes, for example, bus 701, processor 703, memory 705, DSP 707 and ASIC 709 components.

The processor 703 and memory 705 are incorporated in one or more physical packages (e.g., chips). By way of example, a physical package includes an arrangement of one or more materials, components, and/or wires on a structural assembly (e.g., a baseboard) to provide one or more characteristics such as physical strength, conservation of size, and/or limitation of electrical interaction. In certain embodiments the chip set 700 is implemented in a single chip. In other embodiments the chip set or chip 700 is implemented as a single "system on a chip." In some embodiments a separate ASIC would not be used, and all relevant functions as disclosed herein would be performed by a processor or processors, e.g., processor 703. Chip set or chip 700, or a portion thereof, constitutes a mechanism for performing one or more steps of designing an integrated circuit having a device array free from a set of system design rule constraints.

In one or more embodiments, the chip set or chip 700 includes a communication mechanism such as bus 701 for passing information among the components of the chip set 400. Processor 703 has connectivity to the bus 701 to execute instructions and process information stored in, for example, the memory 705. In some embodiments, the processor 703 is also accompanied with one or more specialized components to perform certain processing functions and tasks. Examples of the specialized components include digital signal processors (DSP) 707, and application-specific integrated circuits (ASIC) 709. A DSP 707 typically is configured to process real-world signals (e.g., sound) in real time independently of the processor 703. Similarly, an ASIC 709 is configurable to perform specialized functions not easily performed by a more general purpose processor. Other specialized components to facilitate performing the functions described herein may optionally include ield programmable gate arrays (FPGA), controllers, or other special-purpose computer chips.

In one or more embodiments, the processor (or multiple processors) 703 performs a set of operations on information as specified by computer program code related to designing an integrated circuit having a device array free from a set of system design rule constraints. The computer program code is a set of instructions or statements providing instructions for the operation of the processor and/or the computer system to perform specified functions.

The processor 703 and accompanying components have connectivity to the memory 705 via the bus 701. The memory 705 includes one or more of dynamic memory (e.g., RAM, magnetic disk, writable optical disk, etc.) and static memory (e.g., ROM, CD-ROM, etc.) for storing executable instructions which, when executed, perform the steps described herein to design an integrated circuit having a device array free from a set of system design rule constraints. The memory 705 also stores the data associated with or generated by the execution of the steps.

In one or more embodiments, the memory 705, such as a random access memory (RAM) or any other dynamic storage device, stores information including processor instructions for designing an integrated circuit having a device array free from a set of system design rule constraints. Dynamic memory allows information stored therein to be changed by the integrated circuit design system 100. RAM allows a unit of information stored at a location called a memory address to be stored and retrieved independently of information at neighboring addresses. The memory 705 is also used by the processor 703 to store temporary values during execution of processor instructions. In some embodiments, the memory 705 is a read only memory (ROM) or any other static storage device coupled to the bus 701 for storing static information, including instructions, that is not changed by the integrated circuit design system 100. Some memory is composed of volatile storage that loses the information stored thereon when power is lost. In some embodiments, the memory 705 is a non-volatile (persistent) storage device, such as a magnetic disk, optical disk or flash card, for storing information, including instructions, that persists even when the integrated circuit design system 100 is turned off or otherwise loses power.

The term "computer-readable medium" as used herein refers to any medium that participates in providing information to processor 703, including instructions for execution. Such a medium takes many forms, which include, but are not limited to computer-readable storage medium (e.g., non-volatile media, volatile media). Non-volatile media includes, for example, optical or magnetic disks. Volatile media include, for example, dynamic memory. General forms of computer-readable media include, for example, a floppy disk, a flexible disk, hard disk, magnetic tape, any other magnetic medium, a CD-ROM, CDRW, DVD, any other optical medium, punch cards, paper tape, optical mark sheets, any other physical medium with patterns of holes or other optically recognizable indicia, a RAM, a PROM, an EPROM, a FLASH-EPROM, an EEPROM, a flash memory, any other memory chip or cartridge, or another medium from which a computer can read. The term computer-readable storage medium is used herein to refer to a computer-readable medium.

Some embodiments of the present disclosure provide a system for designing an integrated circuit having pre-layout RC information. The system includes: at least one processor; and at least one memory including computer program code for one or more programs, the at least one memory and the computer program code configured to, with the at least one processor, cause the system to: generate current and voltage information for a schematic having device array layout constraint included; create interconnection topology patterns and realizing route for the schematic; generate RC information according to the route; and determine if the schematic having the device array layout constraint and the RC information included violates one or more of the system design rule constraints.

In some embodiments of the present disclosure, wherein the device array layout constraint is based, at least in part, on a set of device array design rule constraints stored in a device array constraint database, and the system is further caused to: store the RC information in the device array constraint database.

In some embodiments of the present disclosure, wherein the creating the interconnection topology patterns for the schematic includes: displaying a user interface configured to enable interconnection topology patterns to be created or modified by a user based on at least one user input.

In some embodiments of the present disclosure, wherein the realizing the route for the schematic includes: realizing the route for the schematic and performing a real-time electromigration (EM) check, at least in part, based on the generated current information.

In some embodiments of the present disclosure, wherein the realizing the route for the schematic includes: realizing the route for the schematic and performing a real-time voltage-dependent design rule check (VDRC), at least in part, based on the generated voltage information.

In some embodiments of the present disclosure, wherein the system is further caused to: when it is determined that the schematic having the device array layout constraint and the RC information included violates one or more of the system design rule constraints, revise the device array layout constraint.

In some embodiments of the present disclosure, wherein the creating the interconnection topology patterns for the schematic includes: when the current and voltage information is generated without using the RC information corresponding to the schematic, creating the interconnection topology patterns for the schematic.

In some embodiments of the present disclosure, wherein the system is further caused to: when it is determined that the schematic having the device array layout constraint and the RC information included not violates one or more of the system design rule constraints, generate a layout of the integrated circuit based on the schematic of the integrated circuit; and compare the schematic of the integrated circuit to a layout design of the semiconductor device.

Some embodiments of the present disclosure provide a method of designing an integrated circuit having pre-layout RC information, the method including: generating, by a processor, current and voltage information for a schematic having device array layout constraint included; creating interconnection topology patterns and realizing route for the schematic; generating RC information according to the route; and determining if the schematic having the device array layout constraint and the RC information included violates one or more of the system design rule constraints.

In some embodiments of the present disclosure, wherein the device array layout constraint is based, at least in part, on a set of device array design rule constraints stored in a device array constraint database, and the method further includes: storing the RC information in the device array constraint database.

In some embodiments of the present disclosure, wherein the creating the interconnection topology patterns for the schematic includes: displaying a user interface configured to enable interconnection topology patterns to be created or modified by a user based on at least one user input.

In some embodiments of the present disclosure, wherein the realizing the route for the schematic includes: realizing the route for the schematic and performing a real-time electromigration (EM) check, at least in part, based on the generated current information.

In some embodiments of the present disclosure, wherein the realizing the route for the schematic includes: realizing the route for the schematic and performing a real-time voltage-dependent design rule check (VDRC), at least in part, based on the generated voltage information.

In some embodiments of the present disclosure, the method further includes: when it is determined that the schematic having the device array layout constraint and the RC information included violates one or more of the system design rule constraints, revising the device array layout constraint.

In some embodiments of the present disclosure, wherein the creating the interconnection topology patterns for the schematic includes: when the current and voltage information is generated without using the RC information corresponding to the schematic, creating the interconnection topology patterns for the schematic.

In some embodiments of the present disclosure, the method further includes: when it is determined that the schematic having the device array layout constraint and the RC information included not violates one or more of the system design rule constraints, generating a layout of the integrated circuit based on the schematic of the integrated circuit; and comparing the schematic of the integrated circuit to a layout design of the semiconductor device.

Some embodiments of the present disclosure provide a computer readable medium including computer executable instructions for carrying out a method for designing an integrated circuit having pre-layout RC information, the method including: generate current and voltage information for a schematic having device array layout constraint included; create interconnection topology patterns and realizing route for the schematic; generate RC information according to the route; and determine if the schematic having the device array layout constraint and the RC information included violates one or more of the system design rule constraints.

In some embodiments of the present disclosure, wherein the device array layout constraint is based, at least in part, on a set of device array design rule constraints stored in a device array constraint database, and the system is further caused to: store the RC information in the device array constraint database.

In some embodiments of the present disclosure, wherein the method for creating the interconnection topology patterns for the schematic includes: displaying a user interface configured to enable interconnection topology patterns to be created or modified by a user based on at least one user input.

In some embodiments of the present disclosure, wherein the method for the realizing the route for the schematic includes: realizing the route for the schematic and performing a real-time electromigration (EM) check, at least in part, based on the generated current information; and performing a real-time voltage-dependent design rule check (VDRC), at least in part, based on the generated voltage information.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of an integrated circuit, the method comprising:
   performing a pre-layout simulation to obtain current and voltage information for a schematic having device array layout constraint included without RC information;
   creating interconnection topology patterns indicating device pin-to-trunk connections and limitations of distance and location of route based on silicon proven route patterns;
   realizing back end of line (BEOL) route for the schematic according to the interconnection topology patterns and the current and voltage information obtained by the pre-layout simulation without RC information, including:
      performing a real-time electromigration (EM) check and a real-time voltage-dependent design rule check (VDRC); and
      adjusting the interconnection topology patterns according to results of the real-time EM check and the real-time VDRC;
   generating the RC information according to the BEOL route;
   performing the pre-layout simulation to obtain the current and voltage information for the schematic having device array layout constraint included with the RC information;
   determining if the schematic having the device array layout constraint and the RC information included violates one or more of system design rule constraints;
   revising the device array layout constraint when the schematic having the device array layout constraint and the RC information included violates one or more of the system design rule constraints;
   generating a layout of the integrated circuit based on the schematic when the schematic having the device array layout constraint and the RC information included does not violate one or more of the system design rule constraints; and
   causing an integrated circuit to be fabricated according to the layout.

2. The method of claim 1, wherein the device array layout constraint is based, at least in part, on a set of device array design rule constraints stored in a device array constraint database, and the method further comprises: storing the RC information in the device array constraint database.

3. The method of claim 1, wherein the creating the interconnection topology patterns for the schematic comprises:
   displaying a user interface configured to enable interconnection topology patterns to be created or modified by a user based on at least one user input.

4. The method of claim 1, wherein the performing the real-time EM check comprises:
   performing the real-time EM check, at least in part, based on the generated current information.

5. The method of claim 1, wherein the performing the real-time VDRC comprises:
   performing the real-time VDRC, at least in part, based on the generated voltage information.

6. The method of claim 1, wherein the creating the interconnection topology patterns for the schematic comprises:
   when the current and voltage information is generated without using the RC information corresponding to the schematic, creating the interconnection topology patterns for the schematic.

7. The method of claim 1, further comprising: comparing the schematic of the integrated circuit to the layout of the semiconductor device.

8. A method of an integrated circuit, the method comprising:
   generating current and voltage information for a schematic having device array layout constraint included without RC information;
   creating interconnection topology patterns indicating device pin-to-trunk connections and limitations of distance and location of route based on silicon proven route patterns;
   realizing route for the schematic according to the interconnection topology patterns and the current and voltage information generated without RC information, including:
      performing a real-time electromigration (EM) check and a real-time voltage-dependent design rule check (VDRC); and
      adjusting the interconnection topology patterns according to results of the real-time EM check and the real-time VDRC;
   generating the RC information according to the route;
   generating the current and voltage information for the schematic having device array layout constraint included with the RC information;
   determining if the schematic having the device array layout constraint and the RC information included violates one or more of system design rule constraints;
   revising the device array layout constraint when the schematic having the device array layout constraint and the RC information included violates one or more of the system design rule constraints;
   generating a layout of the integrated circuit based on the schematic when the schematic having the device array layout constraint and the RC information included does not violate one or more of the system design rule constraints; and
   fabricating an integrated circuit according to the layout.

9. The method of claim 8, wherein the device array layout constraint is based, at least in part, on a set of device array design rule constraints stored in a device array constraint database, and the method further comprises:
   storing the RC information in the device array constraint database.

10. The method of claim 8, wherein the creating the interconnection topology patterns for the schematic comprises:
displaying a user interface configured to enable interconnection topology patterns to be created or modified by a user based on at least one user input.

11. The method of claim 8, wherein the performing the real-time EM check comprises:
performing the real-time EM check, at least in part, based on the generated current information.

12. The method of claim 8, wherein the performing the real-time VDRC comprises:
performing the real-time VDRC, at least in part, based on the generated voltage information.

13. The method of claim 8, wherein the creating the interconnection topology patterns for the schematic comprises:
when the current and voltage information is generated without using the RC information corresponding to the schematic, creating the interconnection topology patterns for the schematic.

14. The method of claim 8, further comprising:
comparing the schematic of the integrated circuit to the layout of the semiconductor device.

15. A method of an integrated circuit, the method comprising:
performing a pre-layout simulation to obtain current and voltage information for a schematic having device array layout constraint included without RC information;
determining if the RC information is generated;
creating interconnection topology patterns indicating device pin-to-trunk connections and limitations of distance and location of route based on silicon proven route patterns;
realizing route for the schematic according to the interconnection topology patterns and the current and voltage information generated without RC information, including:
performing a real-time electromigration (EM) check and a real-time voltage-dependent design rule check (VDRC); and
adjusting the interconnection topology patterns according to results of the real-time EM check and the real-time VDRC;
generating the RC information according to the route when the RC information is not generated;
performing the pre-layout simulation to obtain the current and voltage information for the schematic having device array layout constraint included with the RC information when the RC information is generated;
determining if the schematic having the device array layout constraint and the RC information included violates one or more of system design rule constraints;
generating a layout of the integrated circuit based on the schematic when the schematic having the device array layout constraint and the RC information included does not violate one or more of the system design rule constraints; and
causing an integrated circuit to be fabricated according to the layout.

16. The method of claim 15, wherein the device array layout constraint is based, at least in part, on a set of device array design rule constraints stored in a device array constraint database, and the method further comprises: storing the RC information in the device array constraint database.

17. The method of claim 15, wherein the method for creating the interconnection topology patterns for the schematic comprises:
displaying a user interface configured to enable interconnection topology patterns to be created or modified by a user based on at least one user input.

18. The method of claim 15, wherein the performing the real-time EM check comprises:
performing the real-time EM check, at least in part, based on the generated current information; and performing the real-time VDRC, at least in part, based on the generated voltage information.

19. The method of claim 15, wherein the method for the creating the interconnection topology patterns for the schematic comprises:
when the current and voltage information is generated without using the RC information corresponding to the schematic, creating the interconnection topology patterns for the schematic.

20. The method of claim 15, further comprising:
comparing the schematic of the integrated circuit to the layout of the semiconductor device.

* * * * *